United States Patent
Tappertzhofen et al.

(10) Patent No.: US 9,443,589 B2
(45) Date of Patent: Sep. 13, 2016

(54) METHOD FOR CAPACITIVELY READING RESISTIVE MEMORY ELEMENTS AND NONVOLATILE, CAPACITIVELY READABLE MEMORY ELEMENTS FOR IMPLEMENTING THE METHOD

(71) Applicants: FORSCHUNGSZENTRUM JUELICH GMBH, Juelich (DE); RHEINISCH-WESTFAELISCHE TECHNISCHE HOCHSCHULE (RWTH) AACHEN, Aachen (DE)

(72) Inventors: Stefan Tappertzhofen, Aachen (DE); Eike Linn, Wuerselen (DE); Lutz Nielen, Aachen (DE); Rainer Waser, Aachen (DE); Ilia Valov, Aachen (DE)

(73) Assignees: Forschungszentrum Juelich GmbH, Juelich (DE); Rheinisch-Westfaelische Technisque Hochschule (RWTH) Aachen, Aachen (DE)

( * ) Notice: Subject to any disclaimer, the term of this patent is extended or adjusted under 35 U.S.C. 154(b) by 0 days.

(21) Appl. No.: 14/895,345
(22) PCT Filed: May 17, 2014
(86) PCT No.: PCT/DE2014/000257
§ 371 (c)(1),
(2) Date: Dec. 2, 2015
(87) PCT Pub. No.: WO2014/202038
PCT Pub. Date: Dec. 24, 2014

(65) Prior Publication Data
US 2016/0111152 A1  Apr. 21, 2016

(30) Foreign Application Priority Data

Jun. 21, 2013 (DE) .......... 10 2013 010 411
Feb. 19, 2014 (DE) .......... 10 2014 002 288

(51) Int. Cl.
G11C 14/00 (2006.01)
G11C 13/00 (2006.01)
(Continued)

(52) U.S. Cl.
CPC ....... *G11C 14/0045* (2013.01); *G11C 11/5685* (2013.01); *G11C 13/003* (2013.01);
(Continued)

(58) Field of Classification Search
CPC .......... G11C 14/0045; G11C 11/5685; G11C 13/004; G11C 11/16; G11C 13/003; G11C 2213/74; G11C 2213/53; G11C 2213/76; G11C 2213/79
See application file for complete search history.

(56) References Cited

U.S. PATENT DOCUMENTS

| | | |
|---|---|---|
| 2006/0120138 A1 | 6/2006 | Liaw et al. |
| 2007/0035990 A1 | 2/2007 | Hush |

(Continued)

FOREIGN PATENT DOCUMENTS

| | | |
|---|---|---|
| DE | 10 2009 023 153 | 12/2010 |
| DE | 10 2011 012 738 | 2/2012 |

(Continued)

*Primary Examiner* — Richard Elms
*Assistant Examiner* — Ajay Ojha
(74) *Attorney, Agent, or Firm* — Jordan and Koda PLLC

(57) ABSTRACT

A method for reading out a non-volatile memory element having at least two stable states 0 and 1. This memory element comprises at least one resistive memory cell, which encodes the two states 0 and 1 into a state HRS having higher electrical resistance and a state LRS having lower electrical resistance. In the two states 0 and 1, the memory element has differing capacitances $C_{0,1}$; this difference is used to determine which state is present. A memory element is selected in which a fixed capacitance that is independent of the state of the memory cell is connected in series with the memory cell. A series connection of a resistive memory cell with a fixed capacitance, instead of with a second resistive memory cell, improves the signal strength during capacitive read-out. The second memory cell becomes indispensable for the memory function when the memory element is read out capacitively. Moreover memory elements were developed which combine a field effect transistor or a DRAM structure with a resistive memory cell or an antiserial series connection of such memory cells.

20 Claims, 2 Drawing Sheets

(51) Int. Cl.
  *G11C 11/56* (2006.01)
  *G11C 11/16* (2006.01)
(52) U.S. Cl.
  CPC .............. *G11C13/004* (2013.01); *G11C 11/16* (2013.01); *G11C 2213/53* (2013.01); *G11C 2213/74* (2013.01); *G11C 2213/76* (2013.01); *G11C 2213/79* (2013.01)

(56) References Cited

U.S. PATENT DOCUMENTS

| | | |
|---|---|---|
| 2007/0297231 A1 | 12/2007 | Gilton |
| 2009/0225584 A1 | 9/2009 | Rao |
| 2010/0283028 A1 | 11/2010 | Brubaker et al. |
| 2011/0181345 A1* | 7/2011 | Ramanathan ............ G11C 11/16 327/509 |
| 2011/0305065 A1 | 12/2011 | Nazarian et al. |
| 2012/0243293 A1 | 9/2012 | Takashima et al. |
| 2012/0262980 A1 | 10/2012 | Rao |

FOREIGN PATENT DOCUMENTS

| | | |
|---|---|---|
| WO | WO-2010/014974 | 2/2010 |
| WO | WO-2010/136056 | 12/2010 |

* cited by examiner

METHOD FOR CAPACITIVELY READING RESISTIVE MEMORY ELEMENTS AND NONVOLATILE, CAPACITIVELY READABLE MEMORY ELEMENTS FOR IMPLEMENTING THE METHOD

The invention relates to a method for capacitively reading out resistive memory elements and to non-volatile, capacitively readable memory elements for carrying out the method.

BACKGROUND OF THE INVENTION

Compared to charge-based memories, such as flash memories, passive resistive memory cells have a simpler design and can therefore be implemented on an ideal surface area of $4F^2$ at a given minimal feature size F. However, in a large array comprising many such memory cells, not only do currents flow through the above-mentioned memory cell, but there are also parasitic current paths through memory cells that have not been mentioned. This is a limiting factor for the maximum array size that can be implemented.

It is known from German patent 10 2009 023 153 to design a resistively switching memory element as an antiserial circuit that is composed of two memory cells. Each such memory element forms a high-resistance resistor, regardless of the state of the element (0 or 1), in parasitic current paths. The element is only briefly low-resistance when it is deliberately addressed while in state 1 and permeated by a read current. In this way, it is also possible to implement large arrays that are composed of many memory elements. This is achieved in exchange for the read-out of a 1 being destructive and the 1 having to be written back into the memory element after read-out.

German patent 10 2011 012 738 provides a method by way of which such memory elements can be read out non-destructively. The prerequisite for this is that the memory cells forming a memory element are manufactured differently, so that they can be distinguished from each other in a series connection via differing contributions to an electrical property of this series connection. The drawback is that this type of manufacture is technologically very complex and worsens the symmetry of the switching behavior of such memory elements.

It is the object of the invention to provide a method for read-out which is still non-destructive, but no longer dependent on two differently manufactured memory cells. It is a further object of the invention to provide memory elements that are in particular suitable for carrying out the method and, at the same time, technologically easy to produce.

These objects are achieved according to the invention by a method according to the main claim and by memory elements according to additional independent claims. Further advantageous embodiments will be apparent from the dependent claims.

SUMMARY OF THE INVENTION

Within the scope of the invention, a method for reading out a non-volatile memory element having at least two stable states 0 and 1 was developed. This memory element comprises at least one resistive memory cell, which encodes the two states 0 and 1 into a state HRS having higher electrical resistance and a state LRS having lower electrical resistance. In the two states 0 and 1, the memory element has differing capacitances $C_{0,1}$; this difference is used to determine which state is present.

According to the invention, a memory element is selected in which a fixed capacitance that is independent of the state of the memory cell is connected in series with the memory cell. The overall capacitance $C_{0,1}$ of the memory element is then composed of the capacitance $C_R$ of the memory cell and the fixed capacitance $C_F$ in different manners depending on the state 0 or 1 of the memory cell. If the memory cell is low-resistance (state 1), this low resistance shunts the capacitance $C_R$ of the memory cell, so that solely $C_F$ is decisive:

$$C_1 = C_F.$$

In contrast, if the memory cell is high-resistance (state 0), the following applies:

$$C_0 = \frac{C_F \cdot C_R}{C_F + C_R}\bigg|$$

It was found that a series connection of a resistive memory cell with a fixed capacitance instead of with a second resistive memory cell improves the signal strength during capacitive read-out according to German patent 10 2011 012 738. According to this patent, two memory cells A and B are connected in series to form a memory element, wherein one of the memory cells is always high-resistance and the other is low-resistance (state combinations A1 and B0 or A0 and B1). To be able to distinguish these states from each other during capacitive read-out, it is necessary for the capacitances of the two memory cells A and B to sufficiently differ from each other. This conflicts with the idea that the two cells should be as identical as possible electrically speaking, so that the memory element as a whole has a switching behavior that is symmetrical to an extent as great as possible. A fixed capacitance, which is connected in series with a single resistive memory cell, is not subject to this tradeoff. It can therefore differ quite drastically from the capacitance of the memory cell.

It was furthermore found that the second memory cell becomes indispensable for the memory function when the capacitive read-out method is used. The second memory cell was originally introduced into the memory elements according to German patent 10 2009 023 153 so as to provide a high-resistance resistor for parasitic current paths through non-addressed memory elements in a matrix, during read-out using a read current through the memory element. If reading out is carried out capacitively without read current, this is no longer a factor. By now implementing a fixed capacitance in a considerably simpler and more compact design than a second memory cell, the same information can be stored in a smaller space at lower costs, without the problem of parasitic current paths returning.

Advantageously, in the state having higher electrical resistance, the fixed capacitance and the capacitance of the memory cell differ from each other by at least a factor of 3, preferably by at least a factor of 5, and especially particularly preferably by at least a factor of 10, so as to supply an optimal signal during capacitive read-out.

However, alternatively, a non-volatile memory element may also be selected, which is an antiserial series connection of two resistive memory cells A and B. The state 0 is then encoded in the state combination A=LRS, B=HRS, and the state 1 is encoded in the state combination A=HRS, B=LRS. In particular, corresponding to German patent 10 2011 012 738, the capacitances of memory cells A and B can differ from each other in the state HRS. The memory element can also have a third stable state ON, which is encoded in the state combination A=LRS, B=LRS.

Within the scope of the invention, a non-volatile memory element having at least two stable states 0 and 1 was developed, which is particularly suitable for carrying out the method according to the invention. This memory element comprises:

- at least one resistive memory cell, which encodes the two states 0 and 1 into a state HRS having higher electrical resistance and a state LRS having lower electrical resistance; or
- at least one antiserial series connection of two such resistive memory cells A and B, which encodes the state 0 in the state combination A=LRS, B=HRS and the state 1 in the state combination A=HRS, B=LRS.

A fixed capacitance that is independent of the state of the memory cell or of the antiserial series connection is connected in series with the memory cell or the antiserial series connection.

According to the invention, the fixed capacitance comprises the gate dielectric of a field effect transistor. This field effect transistor can in particular be a MOSFET or the storage transistor of a flash or EEPROM memory. For example, the resistive memory cell, instead of a metallic gate, can be applied to the gate dielectric covering the semiconducting channel of the transistor. The memory element has the advantage that the field effect transistor acts as both the activating electronic device and as a very sensitive read-out electronic device for the memory cell.

At a particular control voltage $V_{GS}$ between the gate and source, the drain current $I_D$ is defined by $$I_D = \frac{K}{2} \cdot (V_{GS} - V_{th})^2 \Big|,$$

where K is the design parameter that can be set during production and is dependent on the geometry of the transistor. $V_{th}$ is the threshold voltage of the transistor. If the memory cell, and consequently also the memory element, switches from state 0 into state 1, the gate voltage $V_{GS}$ applied to the memory cell is divided differently by the voltage divider composed of memory cell and fixed capacitance. As a result, the threshold voltage $V_{th}$ changes by a magnitude $$\Delta V_{th} = V_{GS} \cdot \left(\frac{C_F}{C_F + C_R}\right) \Big|.$$

Since the threshold voltage is accounted for in the drain current $I_D$ squared, the response of the drain current is highly sensitive to the change in the overall capacitance, and consequently to the switching of the memory cell which caused this change.

The gate dielectric providing the fixed capacitance $C_F$ can have a conventional design, so that no changes need be made to the production process of the field effect transistor, with the exception of replacing the metallic gate with the memory cell. For the production of the memory cell, it is even possible to use the same structuring mask as for the existing metallic gate electrode, since the resistive memory cell, in the simplest form thereof, is a layer arrangement composed of three thin layers (bottom electrode, insulator, top electrode).

In contrast to storage transistors of EEPROM or flash memories, however, the gate dielectric need not be designed to ensure that the charge stored on the floating gate is maintained for a long time. The gate dielectric thus does not have to ensure the non-volatility which, according to the invention, is already inherent in the resistive memory cell. As a result, the gate dielectric can have a thinner design, so that electrons can tunnel through the dielectric already at lower write voltages and drive a current pulse through the memory cell, which switches the cell.

For the resistive memory cell to be switchable, the gate dielectric must be subject to leakage current. The consequence of this is that the leakage current $I_G$ between the gate and source is dependent on the stored state of the resistive memory cell. If this cell is in the state LRS, the leakage current is high; if it is in the state HRS, the leakage current is low. This conflicts with the customary goal that is pursued in the development of transistors of minimizing the leakage current $I_G$, which increases both power consumption and heat development.

For this reason, the design, in which, instead of a single resistive memory cell, an antiserial series connection of two such memory cells A and B is connected in series with the gate dielectric of the field effect transistor, is particularly advantageous. Since this antiserial series connection as a whole is always high-resistance, the current $I_G$ flowing during reading is always low, and additionally independent of whether the memory element is in the state 0 or 1. This applies even when the gate dielectric is entirely omitted, which is to say when the antiserial series connection is directly disposed on the channel of the field effect transistor, in place of the existing gate stack comprising the gate dielectric and gate electrode.

This advantage of the low read current, however, can alternatively also be replaced with the option of storing more than 1 bit of information in the same surface area. The antiserial series connection, and consequently also the memory element, then have a third stable state ON, which is encoded in the state combination A=LRS, B=LRS. While a gate dielectric is then necessary, this does not result in increased space requirement.

The difference in the capacitances that the memory element has as a whole in the states 0 and 1 can be tailored by manufacturing the memory cells A and B differently, in keeping with German patent 10 2011 012 738. If, in contrast, only a single resistive memory cell is connected in series with the gate dielectric, the capacitance of the same can only be activated as a whole by switching to the state HRS or deactivated by switching to the state LRS. The capacitance of the gate dielectric is essentially established by the production technology of the field effect transistor.

An antiserial series connection moreover offers added degrees of freedom for a circuitry-related optimization, for example to increase the switching voltage. For this purpose, in particular the inherent center electrode between the two memory cells A and B can be used. For example, a series resistor can be installed in the series connection. An increase in the switching voltage can be useful, for example, in valence change resistive memories based on CMOS-compatible materials, such as $Ta_2O_5$ or $HfO_2$, so that the resistive memory does not undesirably change state as a result of a read access.

Within the scope of the invention, a further non-volatile memory element having at least two stable states 0 and 1 was developed. According to the invention, this memory element comprises a DRAM memory cell and at least one resistive memory cell, which is connected in series with the capacitor of the DRAM memory cell and encodes the two states 0 and 1 into a state HRS having higher electrical resistance and a state LRS having lower electrical resistance; or at least one antiserial series connection of two such resistive memory cells A and B, which is connected in series with the capacitor of the DRAM memory cell and encodes the state 0 in the state combination A=LRS, B=HRS and the state 1 in the state combination A=HRS, B=LRS.

It was found that the capacitor of the DRAM memory cell is particularly suited as a fixed capacitance for the series connection with a resistive memory cell or with an antiserial series connection within the meaning of the invention, in particular when it has a space-saving design in the form of a trench structure. The series connection with the resistive memory cell or with the antiserial series connection adds to the existing DRAM structure by non-volatility; the information is then no longer stored in the capacitor of the DRAM memory cell, but in the state of the resistive memory cell or of the antiserial series connection.

The entire existing DRAM structure can continue to be used in the production of this non-volatile memory element. It is advantageous to continue to use not only the capacitor, but also the transistor of the DRAM memory cell, since this transistor allows the targeted and undisturbed addressing of a single cell even in large arrays. The memory element is suitable in particular for capacitive read-out by way of the method according to the invention. This applies in particular to a particularly advantageous embodiment of the invention in which the antiserial series connection is connected in series with the capacitor and the select transistor of the DRAM memory cell. Specifically in this embodiment, the memory element is not only suitable for the capacitive read-out, but can equally be activated and operated like a conventional DRAM cell. The two possible states 0 and 1 of the resistive memory cell are then nonetheless differentiated by way of the differing capacitances with which they affect the ultimate result of the read-out. The resistive memory cell is thus also capacitively read out when the memory element as a whole is activated and operated like a conventional DRAM cell.

For example, the resistive memory cell or the antiserial series connection can be connected in series with the capacitor of the DRAM memory cell by applying the resistive memory cell or the antiserial series connection as a layer structure onto the capacitor. For example, this may be designed as a planar metal-insulator-metal structure with the same space requirement.

In a particularly advantageous embodiment of the invention, the capacitor of the DRAM memory cell is designed as a further resistive memory cell. The memory element is then a resistive double cell comprising two memory cells, the capacitances of which differ particularly drastically from each other. The element is thus particularly well-suited for capacitive read-out. Moreover, the element has a particularly space-saving design and is easy to produce based on the existing DRAM structure. So as to convert the capacitor of the DRAM memory cell into a resistive memory cell, it suffices to replace one electrode material, or both electrode materials, and optionally also the dielectric of the capacitor. The resistive memory cell formed by the capacitor can in particular be antiserially interconnected with the resistive memory cell that is connected in series to the capacitor.

In a further particularly advantageous embodiment of the invention, the memory element has a third stable state ON, which is encoded in the state combination A=LRS, B=LRS of the antiserial series connection. It is then possible to store more than one bit of information in the same surface area. For this purpose, the memory element is ideally designed to be capacitively readable within the meaning of German patent 10 2011 012 738, which is to say the two memory cells A and B have differing capacitances. It is then possible to distinguish three capacitance values:

state 0: due to A=LRS, the capacitance of A is shunted, and the capacitance of the series connection is determined by the capacitance of B;

state 1: due to B=LRS, the capacitance of B is shunted, and the capacitance of the series connection is determined by the capacitance of A;

state ON: due to A=LRS and B=LRS, the capacitance of the series connection as a whole is shunted, so that the overall capacitance of the memory element is only determined by the capacitance of the DRAM capacitor.

The subject matter of the invention will be described hereafter based on the figures, without thereby limiting the subject matter of the invention.

DESCRIPTION OF THE PREFERRED EMBODIMENTS

Figure 1:
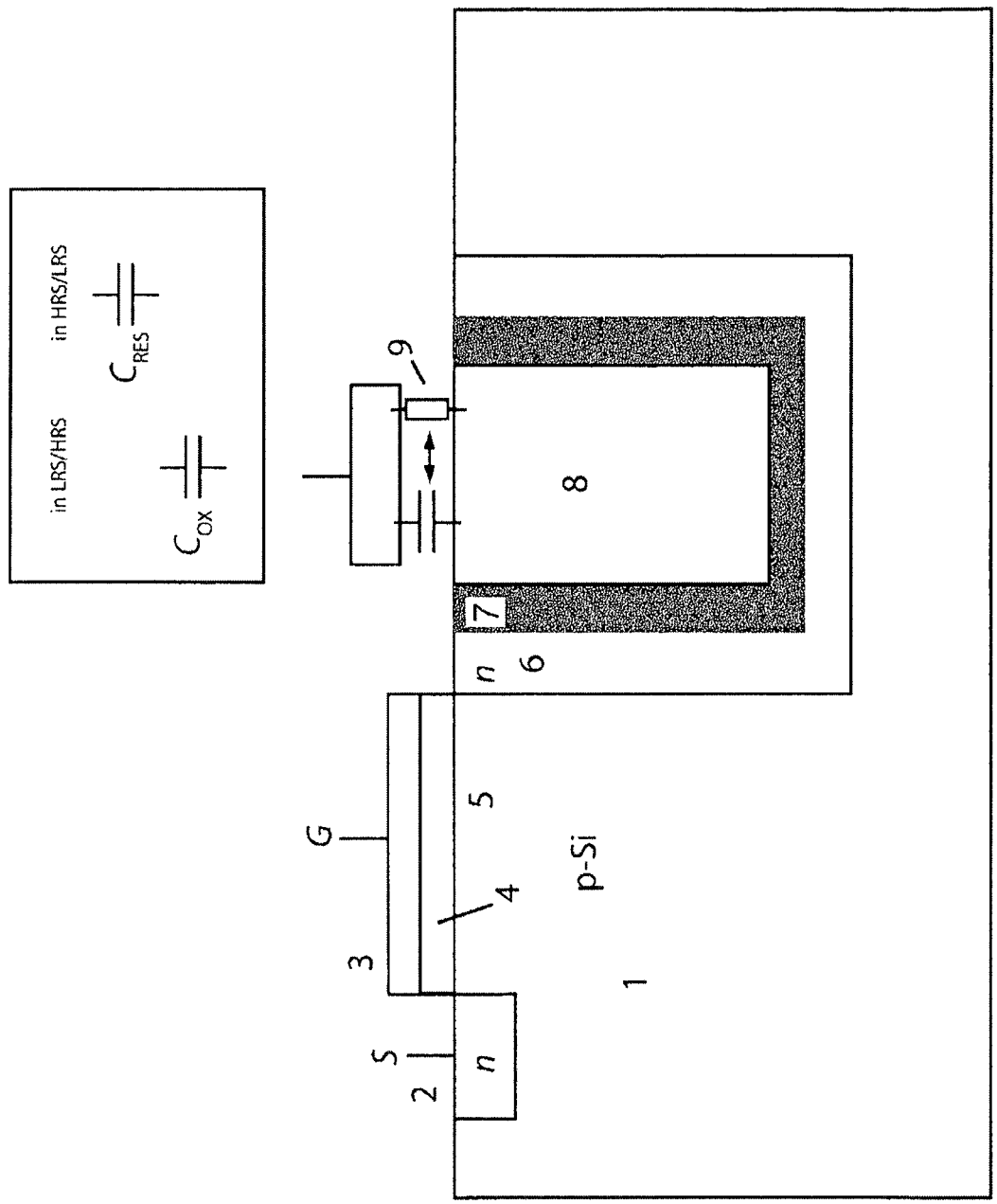
FIG. 1: shows an expansion of a DRAM structure into the memory element according to the invention.

FIG. 1 schematically shows the composition of a memory element according to the invention, which was implemented as a series connection of a DRAM memory cell with a resistive memory cell. The transistor of the DRAM cell comprising an n-doped source region 2, a gate 3 that is insulated by a gate dielectric 4 from the p-doped channel 5, and an n-doped drain region 6 is introduced into a substrate 1 made of p-doped silicon. So as to produce the drain region 6, initially a trench was introduced into the substrate 1, and the wall of this trench was subsequently n-doped. When a voltage is applied between the source 2 and the gate 3, the channel 5 becomes n-conducting, which activates the transistor.

$SiO_2$, which may also be replaced by another dielectric, was applied as the dielectric 7 to the trench wall forming the drain region 6. The trench was then filled with n-doped silicon 8, which may also be replaced by a metal. This silicon 8 and the drain region 6 constitute the plates of the capacitor of the DRAM cell, which are insulated with respect to each other by the dielectric 7.

A resistive memory cell 9 is then applied to the silicon 8. This cell is connected in series with the capacitor (6; 7; 8). The overall capacitance of this series connection depends on the resistance of the memory cell, and thus on the memory state of the same: if the memory cell is low-resistance (state 1), the capacitance thereof is shunted, and only the significantly greater fixed capacitance of the capacitor (6; 7; 8) is decisive for the overall capacitance. If the memory cell is high-resistance, the capacitance thereof acts together with the fixed capacitance The capacitor (6; 7; 8) can likewise be configured as a resistive memory cell by suitably selecting the layer thicknesses of the electrodes (6; 8) and of the dielectric (7). The memory element then continues to constitute a series connection that is composed of the capacitor (6; 7; 8) and the memory cell 9. At the same time, it constitutes a resistive double cell, which is to say a series connection that is composed of two resistive memory cells. If the memory element is in the state 0, this is represented at the level of the memory cells such that the memory cell 9 is in the state 0 (high-resistance), while the memory cell (6; 7; 8) is in the state 1 (low-resistance) (state HRS/LRS). The capacitance $C_{RES}$ of the memory cell 9 is then decisive for the overall capacitance. Conversely, if the memory element is in the state 1, this is represented at the level of the memory cells such that the memory cell 9 is in the state 1 (low-resistance), while the memory cell (6; 7; 8) is in the state 0 (high-resistance) (state LRS/HRS). The capacitance Cox of the memory cell (6; 7; 8), which is considerably greater than the capacitance $C_{RES}$ of the memory cell 9, is then decisive for the overall capacitance. The two states 0 and 1 of the memory element can be distinguished from each other by way of the difference in the overall capacitances.

Figure 2:
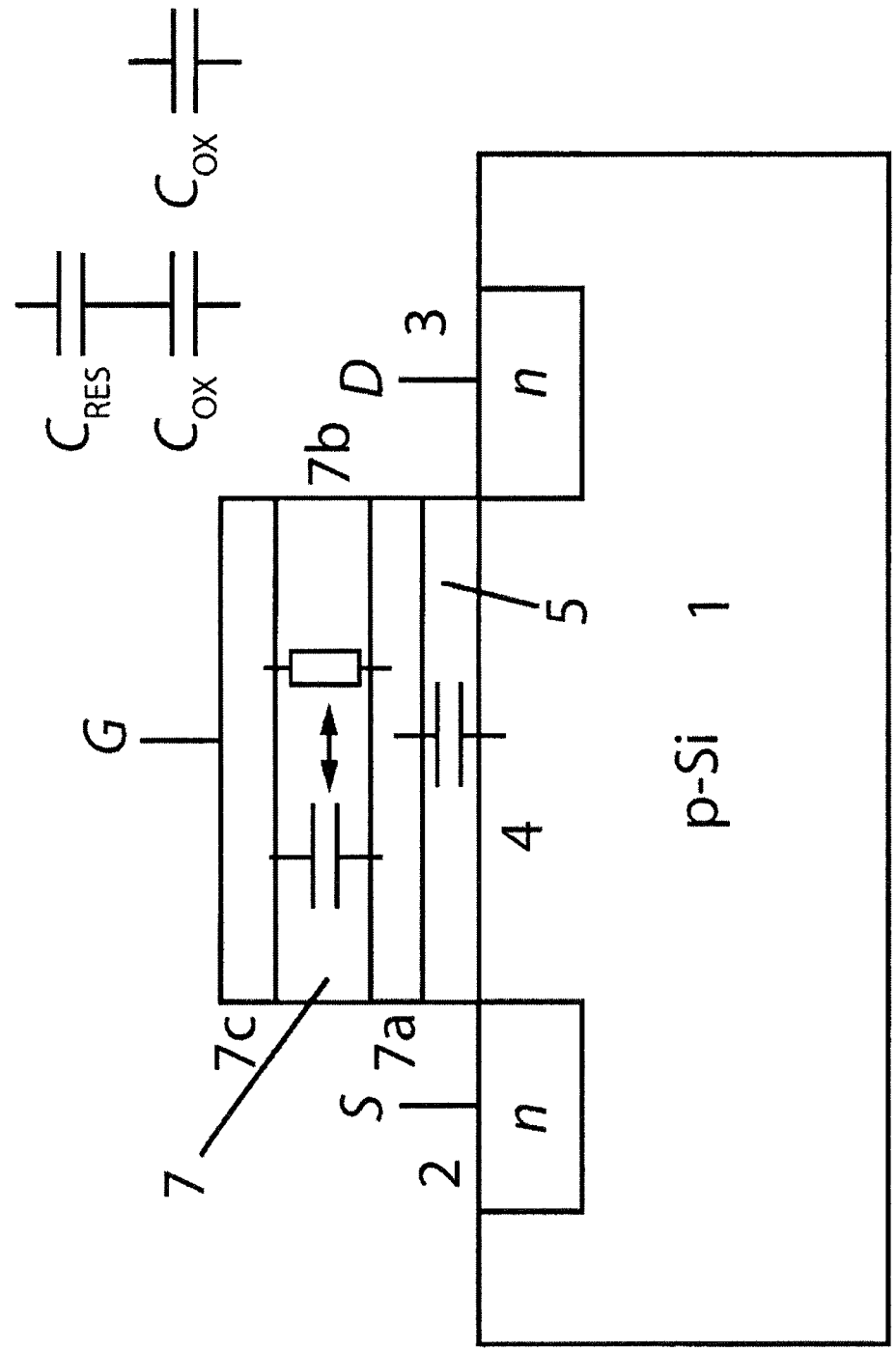
FIG. 2: shows an expansion of a MOSFET into the memory element according to the invention.

FIG. 2 schematically shows the composition of a memory element according to the invention, in which the fixed capacitance comprises the gate dielectric of a MOSFET. The MOSFET is manufactured from a substrate 1 made of p-doped silicon by n-doping both a source region 2 and a drain region 3. This n-doping can be carried out subsequently on the p-substrate, without having to physically remove material and replacing it with n-doped material. The p-doped channel 4, which is covered by the gate dielectric 5, is located between the source region 2 and the drain region 3. Instead of the conventional gate electrode, a resistive memory cell 7 is now applied to the gate dielectric. This is manufactured using planar metal-insulator-metal (MIM) technology and comprises a bottom electrode 7a, which adjoins the gate dielectric, a dielectric 7b, and a top electrode 7c. The bottom electrode 7a, the gate dielectric 5, and the substrate 1, comprising the channel 4, form the fixed capacitance Cox, which in turn is connected in series to the memory cell 7. When the memory cell is in the state 0 (high-resistance, HRS), the capacitance $C_{RES}$ thereof acts together with this fixed capacitance Cox; when the cell is in the state 1 (low-resistance, LRS), the capacitance $C_{RES}$ thereof is shunted, and the overall capacitance is determined by the fixed capacitance Cox. When a voltage is applied between the source 2 and the bottom electrode 7a of the memory cell, the channel 4 becomes n-conducting, which activates the transistor.

The invention claimed is:

1. A method for reading out a non-volatile memory element having at least two stable states 0 and 1, the non-volatile memory element comprising a DRAM memory cell and an antiserial connection of two resistive memory cells A and B, which are connected in series with a capacitor of the DRAM memory cell, the method comprising:
    encoding one state of the stable states 0 and 1 into a state in which resistive memory cell A has a low resistance state (LRS) and resistive memory cell B has a high resistance state (HRS); and
    encoding another state of stable states 0 and 1 into a state in which resistive memory cell A has a high resistance state (HRS) and resistive memory cell B has a low resistance state (LRS).

2. The method according to claim 1, wherein capacitance of the non-volatile memory element in stable state 0 and stable state 1 differ by at least a factor of 3.

3. The method according to claim 1, wherein capacitance of the non-volatile memory element in stable state 0 and stable state 1 differ by at least a factor of 5.

4. The method according to claim 1, wherein capacitance of the non-volatile memory element in stable state 0 and stable state 1 differ by at least a factor of 10.

5. The method of claim 1, further comprising:
    encoding a third stable state of the at least two stable states as an on state in which resistive memory cell A of the antiserial series connection has a low resistance state (LRS) and resistive memory cell B of the antiserial series connection has a low resistance state (LRS).

6. A non-volatile memory element having at least two stable states 0 and 1, comprising a DRAM memory cell and:
    at least one resistive memory cell, which is connected in series with the capacitor of the DRAM memory cell and encodes the two states 0 and 1 into a state HRS having higher electrical resistance and a state LRS having lower electrical resistance; or
    at least one antiserial series connection of two such resistive memory cells A and B, which is connected in series with the capacitor of the DRAM memory cell and encodes the state 0 in the state combination A=LRS, B=HRS and the state 1 in the state combination A=HRS, B=LRS.

7. The memory element according to claim 6, wherein the resistive memory cell or the antiserial series connection is connected in series with the capacitor and the select transistor of the DRAM memory cell.

8. The memory element according to claim 6, wherein the resistive memory cell or the antiserial series connection is applied as a layer structure onto the capacitor of the DRAM memory cell.

9. The memory element according to claim 8, wherein the capacitor of the DRAM memory cell is designed as a further resistive memory cell.

10. A memory element according to claim 6, comprising a third stable state ON, which is encoded in the state combination A=LRS, B=LRS of the antiserial series connection.

11. A non-volatile memory element having at least two stable states 0 and 1, comprising:
    at least one resistive memory cell, which encodes the two states 0 and 1 into a state HRS having higher electrical resistance and a state LRS having lower electrical resistance; or
    at least one antiserial series connection of two such resistive memory cells A and B, which encodes the state 0 in the state combination A=LRS, B=HRS and the state 1 in the state combination A=HRS, B=LRS,
    a fixed capacitance that is independent of the state of the memory cell or of the antiserial series connection being connected in series with the memory cell or the antiserial series connection, wherein the fixed capacitance comprises the gate dielectric of a field effect transistor.

12. The memory element according to claim 11, wherein the field effect transistor is a MOSFET or the storage transistor of a flash or EEPROM memory.

13. A non-volatile memory element having at least two stable states 0 and 1, comprising:
    a DRAM memory cell comprising a capacitor; and
    at least one antiserial series connection comprising two resistive memory cells A and B, which are connected in series with the capacitor of the DRAM memory cell and encodes the state 0 in a state combination A=LRS, B=HRS and the state 1 in the state combination A=HRS, B=LRS.

14. The memory element according to claim 13, wherein the antiserial series connection is connected in series with the capacitor and a select transistor of the DRAM memory cell.

15. The memory element according to claim 13 wherein the antiserial series connection is applied as a layer structure onto the capacitor of the DRAM memory cell.

16. The memory element according to claim 15, wherein the capacitor of the DRAM memory cell is designed as a further resistive memory cell.

17. A memory element according to claim 13, comprising a third stable state ON, which is encoded in the state combination A=LRS, B=LRS of the antiserial series connection.

18. The memory element according to claim 13, wherein said at least one antiserial series connection encodes a third stable state of the at least two stable states as an on state in which resistive memory cell A of the antiserial series connection has a low resistance state (LRS) and resistive memory cell B of the antiserial series connection has a low resistance state (LRS).

19. A non-volatile memory element having at least two stable states 0 and 1, comprising:
at least one antiserial series connection comprising two resistive memory cells A and B, which encodes the state 0 in a state combination A=LRS, B=HRS and the state 1 in the state combination A=HRS, B=LRS, and
a fixed capacitance, which is independent of the state of the antiserial series connection, being connected in series with the antiserial series connection, wherein the fixed capacitance comprises a gate dielectric of a field effect transistor.

20. The memory element according to claim 19, wherein the field effect transistor is a MOSFET or a storage transistor of a flash or EEPROM memory.

* * * * *